United States Patent

Hall, Jr.

[11] Patent Number: 5,464,485
[45] Date of Patent: Nov. 7, 1995

[54] COAXIAL THERMOELEMENTS AND THERMOCOUPLES MADE FROM COAXIAL THERMOELEMENTS

[75] Inventor: Bertie F. Hall, Jr., Ann Arbor, Mich.

[73] Assignee: Hoskins Manufacturing Co., Detroit, Mich.

[21] Appl. No.: 254,675

[22] Filed: Jun. 3, 1994

Related U.S. Application Data

[63] Continuation of Ser. No. 86,151, Jul. 1, 1993, abandoned.

[51] Int. Cl.$^6$ .................................................. H01L 35/08
[52] U.S. Cl. ..................... 136/230; 136/233; 136/236.1; 136/241; 374/179; 374/208
[58] Field of Search ...................... 136/230, 231, 136/232, 233, 236.1, 241; 374/179, 208

[56] References Cited

U.S. PATENT DOCUMENTS

| | | | |
|---|---|---|---|
| 764,176 | 7/1904 | Bristol | 374/174 |
| 885,430 | 4/1908 | Bristol | 136/239 |
| 1,651,750 | 12/1927 | Brophy | 136/228 |
| 2,466,175 | 4/1949 | Kretsch et al. | 136/4 |
| 2,509,825 | 5/1950 | Keyser | 136/4 |
| 2,644,851 | 7/1953 | Tapke | 136/4 |
| 2,987,565 | 6/1961 | Barnhart et al. | 136/4 |
| 3,013,097 | 12/1961 | Fritts et al. | 136/4 |
| 3,022,361 | 2/1962 | Fritts et al. | 136/4 |
| 3,065,286 | 11/1962 | Connell | 136/4 |
| 3,116,168 | 12/1963 | Gee | 136/4 |
| 3,283,397 | 11/1966 | Beckman | 29/155.5 |
| 3,305,405 | 2/1967 | Jamieson | 136/232 |
| 3,343,589 | 9/1967 | Holzl | 164/46 |
| 3,449,174 | 6/1969 | Kleinle | 136/228 |
| 3,463,674 | 8/1969 | Black et al. | 136/233 |
| 3,556,864 | 1/1971 | Wagner | 136/228 |
| 3,741,816 | 6/1973 | Wagner | 136/228 |
| 3,774,297 | 11/1973 | Wagner | 29/573 |
| 3,819,420 | 6/1974 | Schmidt et al. | 136/228 |
| 3,845,706 | 11/1974 | Strimple et al. | 73/539 |
| 3,929,511 | 12/1975 | Solomon | 136/228 |
| 3,973,997 | 8/1976 | Solomon | 136/228 |
| 3,980,504 | 9/1976 | Wagner | 136/228 |
| 4,450,314 | 5/1984 | Huther | 136/230 |
| 4,512,827 | 4/1985 | Gill | 156/48 |
| 4,732,619 | 3/1988 | Nanigian | 136/228 |
| 5,111,002 | 5/1992 | Hollander | 174/102 P |

FOREIGN PATENT DOCUMENTS

| | | | |
|---|---|---|---|
| 2528187 | 1/1976 | Germany | 136/232 |
| 55-125421 | 9/1980 | Japan | 136/230 |
| 1233331 | 9/1989 | Japan | 374/179 |
| 1264010 | 10/1986 | U.S.S.R. | 374/179 |
| 854570 | 11/1960 | United Kingdom | 136/233 |

*Primary Examiner*—Donald P. Walsh
*Assistant Examiner*—Chrisman D. Carroll
*Attorney, Agent, or Firm*—Brooks & Kushman

[57] ABSTRACT

A coaxial thermoelement having a thermocouple wire coaxially disposed in a tubular metal sheath. A ceramic powder electrically is disposed in the tubular metal sheath to insulate the thermocouple wire from the tubular metal sheath. A thermocouple is formed by fusing the thermocouple wire to its metal sheath in each of two coaxial thermoelements and joining the fused ends of the two coaxial thermoelement to form a thermocouple junction.

8 Claims, 1 Drawing Sheet

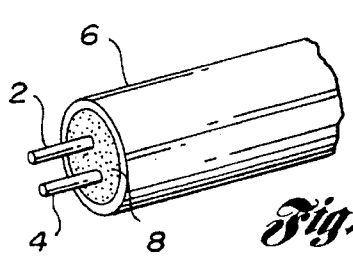
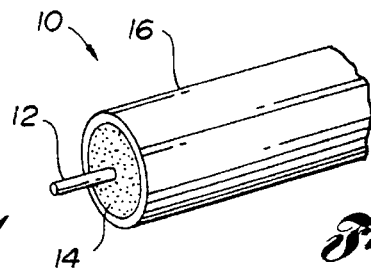
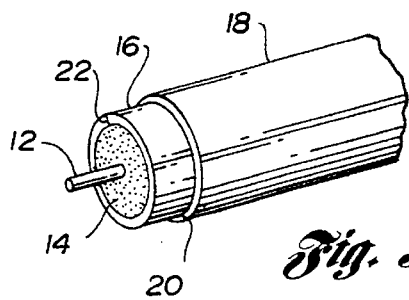
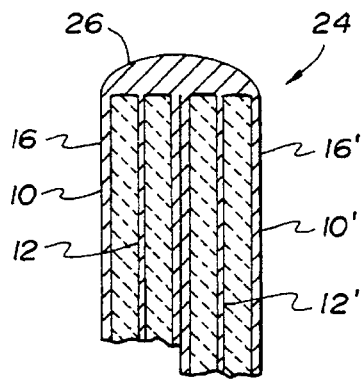
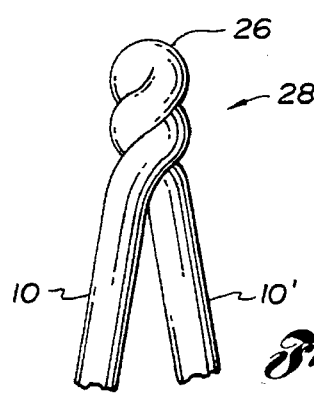
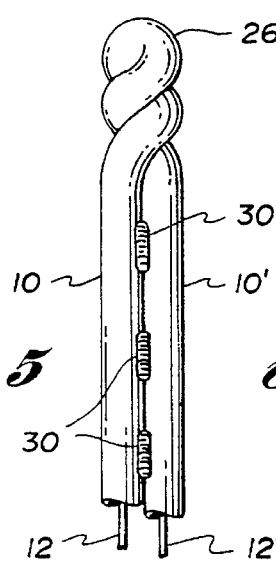
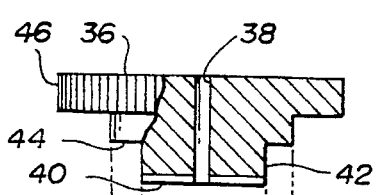
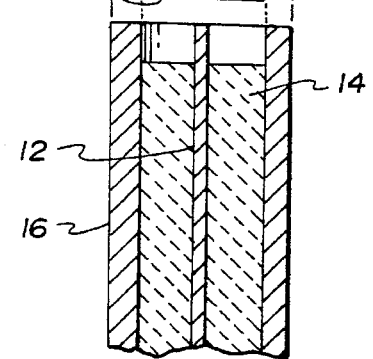
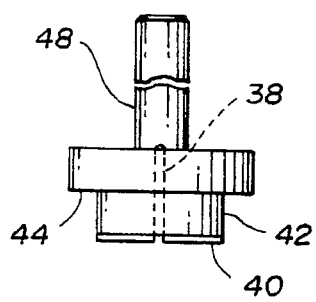

COAXIAL THERMOELEMENTS AND THERMOCOUPLES MADE FROM COAXIAL THERMOELEMENTS

This is a continuation of application Ser. No. 08/086,151, filed on Jul. 1, 1993, now abandoned.

TECHNICAL FIELD

The invention is related to the field of thermocouples and, in particular, to coaxial thermoelements and thermocouples made from the coaxial thermoelements.

BACKGROUND ART

The fabrication of thermocouples using tubular metal sheaths is known in the art. Solomon in U.S. Pat. No. 3,973,997, Wagner in U.S. Pat. No. 3,980,504 and Nanigian in U.S. Pat. No. 4,732,619 teach a thermocouple formed between a tubular metal sheathing and an internal thermocouple wire. The tubular metal sheathing and the internal wire are electrically joined at one end to form a thermocouple junction where the metal sheathing is one of the thermocouple elements and the internal wire is the other. Alternatively, as taught by Gill in U.S. Pat. No. 4,512,827, two thermocouples wires, such as thermal couple wires 2 and 4 are encased in a common metal sheath, as shown in FIG. 1. The thermocouple wires 2 and 4 are insulated from each other and from the metal sheath by a powdered insulating material 8.

In this type of thermocouple, the powdered insulating material solidifies during the drawing process to reduce the diameter of the thermocouple assembly, thereby making it difficult to remove the material from between the thermocouple wires and the inner walls of the metal sheathing in order to form a thermocouple junction. In addition, the thermocouple wires must be selected from thermocouple alloys to compensate for changes in their calibration that occur during manufacture. The procedure for doing this is one of trial and error. It is only after processing that the thermo-electromotive force (EMF) of the resultant thermocouple assembly is determined to be suitable for standard or special limits of error. There is little that can be done after the sheathed thermocouple cable is completed.

In the alternative, Kleinle in U.S. Pat. No. 3,449,174 teaches a coaxial thermoelement in which the metal sheathing is made from the same metal or alloy as the coaxial thermocouple wire, while Black et al in U.S. Pat. No. 3,463,674 discloses a thermocouple in which a thermocouple junction is formed by two thermocouple wires joined end-to-end. The thermocouple junction and the thermocouple wires are covered by an insulating layer and enclosed by a common metal sheath. A second metal sheath is added in the vicinity of the thermocouple junction and the second metal sheath is reduced by drawing or swaging to a diameter substantially equal to the diameter of the first metal sheath.

SUMMARY OF THE INVENTION

The invention is a coaxial thermoelement for making thermocouples and has a thermocouple wire coaxially enclosed in a tubular metal sheath and electrically insulated therefrom by a ceramic insulating material. The thermocouple wire has thermoelectric constants different from the thermoelectric constants of the tubular metal sheath. A thermocouple is formed by electrically joining the ends of first and second coaxial thermoelements by fusing the thermocouple wire and the metal sheath of the first and second coaxial thermoelements together in a common weld bead. The thermoelectrical constants of the thermocouple wires in the first and second coaxial thermoelements being different from each other and from the thermoelectric constants of the tubular metal sleeves.

One advantage of the invention is that the coaxial thermoelements can be drawn continuously without an anneal to a much greater accumulated diameter reduction than thermoelements having two thermocouple wires as taught by the prior art.

Another advantage is that the coaxial thermoelements may be calibrated individually, permitting matching of individual coaxial thermoelements to offset changes in the thermoelectric constants induced by subsequent drawing to reduce errors in the finished thermocouples.

Still another advantage is that the ends of the coaxial thermoelements may be easily cleaned to remove the ceramic insulating material from between the thermocouple wire and the metal sheathing to a depth sufficient to fuse the thermocouple wire to the metal sheath.

These and other advantages will become more apparent from a reading of the specification in conjunction with the drawings.

BRIEF DESCRIPTION OF THE DRAWINGS

FIG. 1 is a perspective view of a prior art thermoelement having two thermocouple wires in a common sheath;

FIG. 2 is a perspective view of the coaxial thermoelement;

FIG. 3 is an alternate embodiment of the coaxial thermoelement having a second sheathing layer;

FIG. 4 is a thermocouple made from two coaxial thermoelements;

FIG. 5 is a thermocouple in which the ends of the coaxial thermoelements are twisted about each other;

FIG. 6 is a thermocouple in which the coaxial thermoelements are welded to each other along the length;

FIG. 7 is a thermocouple in which the ends of the coaxial thermoelements are spatially separated;

FIG. 8 is a cross-sectional view of an end of a coaxial thermoelement and a trepanning tool; and FIG. 9 is an alternate embodiment of the trepanning tool.

DETAILED DESCRIPTION OF THE INVENTION

The structure of the coaxial thermoelement 10 is shown in FIG. 2. The coaxial thermoelement 10 has a central thermocouple wire 12 surrounded by an insulating material 14 and enclosed within an outer metal jacket or tubular metal sheath 16. The thermocouple wire 12 may be selected from any of the metals or alloys used in the thermocouple art and may have either positive, negative, or neutral thermoelectric characteristics. For example, the thermocouple wire 12 my be made from platinum, a platinum rhodium alloy, "CHROMEL", "ALUMEL", copper, iron, constantan or any other metal or alloy used for thermocouples. The insulating material 14 is preferably a ceramic powder, such as magnesium oxide powder. The outer jacket or sheath 16 may be made from any metal or alloy, such as commonly used in making continuously welded tubing which has good working and drawing properties.

The coaxial thermoelement 10 is made by using standard tube forming processes such as taught by Gill in U.S. Pat. No. 4,512,827. In the drawing of the coaxial thermoelement 10, only a single thermocouple wire 12 is fed into a tubular metal sheath or jacket 16 as it is being continuously formed. Gill also teaches the addition of the insulating ceramic powder into the metal sheath 16 during its fabrication process.

Although the tubular coaxial thermoelement shown in FIG. 2 has only a single metal sheath 16, the metal jacket or sheath may comprise two or more metal sheaths disposed over the metal sheath 16 such as a second sheath 18 as shown in FIG. 3.

In the embodiment of FIG. 3, the seam 20 such as a weld or braze seam of the second metal sheath 18 is displaced from, and preferably diametrically opposite, the seam 22 of the first sheath 16. The additional layer or layers of sheathing material prevents the loss of the insulating material if a seam is accidentally or inadvertently ruptured during a subsequent drawing process or when the finished product is bent.

The advantage of the coaxial element 10 is that it may be drawn continuously without anneal to a much greater accumulated diameter reduction than the diameters currently obtainable when two thermocouple wires are enclosed in a common metal sheath as taught by the prior art.

One of the problems encountered by the prior art is that the thermoelectric constants of the thermocouple wires change when being drawn to a smaller diameter. As used herein, the thermo-electromotive force (EMF) generated by a thermocouple junction of a metal or alloy with a metal lead (Pb) is given by the equation:

$$EMF_T = A\theta^2 + B\theta$$

where $\theta$ is the temperature and A and B are constants. The metal lead is used as a standard and its thermoelectric constants A and B have been defined as being equal to 0. As a result, the thermo-electromotive force produced by thermocouples formed when both thermocouple wires are enclosed in a common sheath may change not only from batch-to-batch, but also may change within a common batch. This results in the user having to order precalibrated thermocouples having the same thermo-electromotive force characteristics as a failed thermocouple or recalibrate the system to accommodate a thermo-electromotive force characteristics of the new thermocouple.

The advantage of the coaxial thermoelements 10 is that the thermo-electromotive force characteristics of the individual coaxial thermoelements may be selected by the user to produce the desired thermo-electromotive characteristics.

A thermocouple 24 is made by joining the ends of two coaxial thermoelements 10 and 10', as shown in FIG. 4. The metal sheaths 16 and 16' of the thermoelements 10 and 10' are made from the same metal and do not contribute to the electromotive force generated by the resultant thermocouple 24. The ends of the two coaxial thermoelements 10 and 10' are fused, such as by welding to form a thermocouple junction in the form of a weld bead or cap 26 connecting the metal sheaths 16 and 16' to each other as well as connecting the thermocouple wires 12 and 12' to each other.

As shown in FIG. 5, the coaxial thermoelements 10 and 10' forming a thermocouple 28 may be twisted together to provide added mechanical strength at their ends adjacent to weld bead 26. Further as shown in FIG. 6, the metal sheaths 12 and 12' of coaxial thermoelements 10 and 10', respectively, may be welded or otherwise electrically connected to each other along their lengths as indicated by welds 30.

FIG. 7 shows an alternate embodiment of a thermocouple 32 in which the ends of the individual coaxial thermoelements 10 and 10' are separated from each other. The ends of the individual coaxial thermoelements 10 and 10' are individually sealed by welding to form weld beads 34 and 34', respectively. The metal sheaths of the coaxial thermoelement 10 and 10' are electrically connected to each other in a region adjacent to the welding beads 34 and 34', where it will be at the same temperature as the ends of the individual coaxial thermoelements 10 and 10'.

The coaxial thermoelements are user-friendly and permit the user to make his own thermocouples. As shown in FIG. 8, the trepanning operation to remove the ceramic material from between the internal surface of the tubular metal sheath and the thermocouple wire member to the desired depth may be performed by a simple trepanning tool 36. The trepanning tool 36 has a through bore 38 having a diameter slightly larger than the diameter of the thermocouple wire 12 and annular cutter 40 provided at the end of an annular shaft portion 42. The depth at which the trepanning tool 36 removes the insulating material 14 from between the axially disposed thermocouple wire 12 and internal surface of the metal sheath 16 is determined by the length of the shaft portion 42. An annular shoulder 44 engages the edge of the tubular metal sheath 16 when the trepanning tool 36 has removed the insulating material 14 from between the thermocouple wire 12 and the tubular metal sheath 16 to a depth sufficient to make satisfactory weld bead 26 at the end of the coaxial thermoelement 10. The trepanning tool 36 has a knurled knob 46 which permits the trepanning tool 36 to be manually rotated.

Alternatively, the trepanning tool 36 may have a shank 48 as shown in FIG. 9 by means of which it may be mounted in a suitable rotatable tool such as a power screwdriver or a drill. The ability of the ultimate user to easily remove a predetermined quantity of the insulating material from the end of the coaxial thermoelement, to permit the formation of a weld bead fusing the thermocouple wire 12 to the tubular metal sheath 16 or to another thermoelectric member having different thermoelectric constants, greatly enhances the flexibility of the coaxial thermoelectric elements.

As a result, relatively unskilled welders can repeatedly make weld beads at the end of the coaxial thermoelement 10, electrically connecting the coaxial thermocouple wire 12 with the sheath 16. The two wire, single sheath construction taught by the prior art requires a greater degree of skill and difficulties are often encountered in effectively removing the insulating material 14 from between and adjacent to the two thermocouple wires due to their non-circular configuration.

The lower cost of the coaxial thermoelements and the ease of welding leads to a higher quality thermocouple product than glass or ceramic fiber insulated thermocouple wires at a competitive price. Since the thermocouple wire 12 of the coaxial thermoelement is protected from oxidation and other types of corrosion by the tubular metal sheath 16, greater stability and longer life are assured.

Having disclosed a preferred embodiment of the invention which has been described in detail with respect to the drawings, it is recognized that those skilled in the art may make certain changes and improvements within the scope of the appended claims.

What is claimed is:

1. A coaxial thermoelement consisting essentially of:
   a continuous thermocouple wire having a predetermined length, said thermocouple wire being selected from a group of thermoelectric metals consisting of "ALUMEL", "CHROMEL", iron, copper, "CONSTANTAN", platinum and alloys of platinum and rhodium;

at least one tubular metal sheath circumscribing said thermocouple wire, each of said at least one tubular metal sheath extending from one end to its other end for a distance substantially equal to said predetermined length to protect the thermocouple wire during manufacturing and in use, said at least one metal sheath being made from a metal different from said thermocouple wire; and an insulating ceramic powder disposed in said at least one metal sheath to support said thermocouple wire coaxially within said at least one metal sheath and to electrically insulate said thermocouple wire from said at least one metal sheath along said predetermined length.

2. A thermocouple comprising:

a first coaxial thermoelement having a first thermocouple wire axially disposed in a first metal sheath, and an insulator material supporting said first thermoelectric wire coaxially within said first metal sheath and insulating said first wire from said first metal sheath along the entire length of said first metal sheath, said first thermocouple wire being selected from a group of thermoelectric metals and alloys consisting of "CHROMEL", "ALUMEL", iron, copper, "CONSTANTAN", platinum and alloys of platinum and rhodium, said first metal sheath being made from a metal having a composition different from said group of thermoelectric metals and alloys;

a second coaxial thermoelement having a second thermocouple wire axially disposed in a second metal sheath, and an insulator material of the second coaxial thermoelement supporting said second thermocouple wire coaxially within said second metal sheath along the entire length of said second metal sheath, said second thermocouple wire being selected from said group of thermoelectric metals, the thermoelectric metal of said second thermocouple wire being different from said thermoelectric metal of said first thermocouple wire, said second metal sheath being made from a metal having a composition substantially the same as the composition of said metal of said first metal sheath;

each sheath circumscribing its associated thermocouple wire from one end to its other end to protect said wire during manufacturing and in use, and means for electrically connecting to each other at one end thereof said first metal sheath and said first thermocouple wire of said first thermoelement with said second thermocouple wire and said second metal sheath of said second coaxial thermoelement.

3. The thermocouple of claim 2 wherein said first and second thermocouple wires and said insulating ceramic powder are continuously inserted into said first and second metal sheaths as said first and second metal sheaths are being formed.

4. The thermocouple of claim 2 wherein said means for electrically connecting comprises a weld bead fusing said first metal sheath and said first thermocouple wire of said first coaxial thermoelement to said second tubular metal sheath and said second thermocouple wire of said second coaxial thermoelement.

5. The coaxial thermoelement of claim 1 wherein said at least one tubular metal sheath is a first metal sheath having a longitudinal seam, said at least one tubular metal sheath further comprising a second tubular metal sheath having a longitudinal seam displaced from said longitudinal seam of said first tubular metal sheath.

6. The thermocouple of claim 4 wherein said first and second coaxial thermoelements are twisted about each other adjacent to said one end.

7. The thermocouple of claim 6 wherein said first and second metal sheaths of said first and second coaxial thermoelements are electrically connected to each other at predetermined locations along their length.

8. The thermocouple of claim 2 wherein said means for electrically connecting comprises:

a first weld bead fusing said first metal sheath and said first thermocouple wire of said first coaxial thermoelement to each other;

a second weld bead fusing said second metal sheath and said second thermocouple wire of said second coaxial thermoelement to each other; and means for electrically connecting said first and second metal sheaths of said first and second coaxial thermoelements in a region adjacent to said first and second weld beads.

* * * * *